(12) United States Patent
Hadizad

(10) Patent No.: US 6,818,939 B1
(45) Date of Patent: Nov. 16, 2004

(54) VERTICAL COMPOUND SEMICONDUCTOR FIELD EFFECT TRANSISTOR STRUCTURE

(75) Inventor: Peyman Hadizad, Scottsdale, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 10/623,397

(22) Filed: Jul. 18, 2003

(51) Int. Cl.[7] .................... H01L 29/76; H01L 29/94; H01L 31/119; H01L 21/8242; H01L 21/336

(52) U.S. Cl. ................ 257/302; 438/242; 438/259; 438/270; 438/271; 438/272; 257/288; 257/328; 257/330; 257/332

(58) Field of Search .......................... 257/302, 288, 257/328, 330, 332; 438/242, 259, 270–272

(56) References Cited

U.S. PATENT DOCUMENTS

| | | | |
|---|---|---|---|
| 4,262,296 A | | 4/1981 | Shealy et al. |
| 4,651,184 A | * | 3/1987 | Malhi ........................ 257/302 |
| 4,661,832 A | * | 4/1987 | Lechaton et al. ........... 257/506 |
| 5,208,657 A | * | 5/1993 | Chatterjee et al. .......... 257/302 |
| 5,231,037 A | | 7/1993 | Yuan et al. |
| 5,326,711 A | * | 7/1994 | Malhi ........................ 438/138 |
| 5,610,085 A | | 3/1997 | Yuan et al. |
| 6,277,751 B1 | * | 8/2001 | Niu et al. .................. 438/692 |
| 6,316,807 B1 | * | 11/2001 | Fujishima et al. .......... 257/333 |
| 6,356,059 B1 | | 3/2002 | Yu |
| 6,673,681 B2 | * | 1/2004 | Kocon et al. ............... 438/270 |
| 2002/0024081 A1 | * | 2/2002 | Gratz ........................ 257/301 |
| 2002/0058381 A1 | * | 5/2002 | Lee ............................ 438/259 |
| 2002/0113263 A1 | * | 8/2002 | Fujishima et al. .......... 257/330 |
| 2003/0073271 A1 | * | 4/2003 | Birner et al. ............... 438/197 |
| 2004/0031987 A1 | * | 2/2004 | Henninger et al. ......... 257/328 |

FOREIGN PATENT DOCUMENTS

EP   0874394   10/1998   ......... H01L/21/337

* cited by examiner

Primary Examiner—Amir Zarabian
Assistant Examiner—Ida M. Soward
(74) Attorney, Agent, or Firm—Kevin B. Jackson

(57) ABSTRACT

In one embodiment, a compound semiconductor vertical FET device (11) includes a first trench (29) formed in a body of semiconductor material (13), and a second trench (34) formed within the first trench (29) to define a channel region (61). A doped gate region (59) is then formed on the sidewalls and the bottom surface of the second trench (34). Source regions (26) are formed on opposite sides of the double trench structure (28). Localized gate contact regions (79) couple individual doped gate regions (59) together. Contacts (84, 85, 87) are then formed to the localized gate contact regions (79), the source regions (26), and an opposing surface (21) of the body of semiconductor material (13). The structure provides a compound semiconductor vertical FET device (11, 41, 711, 712, 811, 812) having enhanced blocking capability and improved switching performance.

13 Claims, 4 Drawing Sheets

VERTICAL COMPOUND SEMICONDUCTOR FIELD EFFECT TRANSISTOR STRUCTURE

RELATED APPLICATIONS

This application is related to co-pending U.S. patent application Ser. No. 10/623,390, entitled "DC/DC CONVERTER WITH DEPLETION MODE COMPOUND SEMICONDUCTOR FIELD EFFECT TRANSISTOR SWITCHING DEVICE", by Peyman Hadizad, assigned to the same assignee, Semiconductor Components Industries, LLC, filed concurrently herewith, and which is incorporated by reference for purposes.

This application is further related to co-pending U.S. patent application Ser. No. 10/623,392, entitled "METHOD OF MAKING A VERTICAL COMPOUND SEMICONDUCTOR FIELD EFFECT TRANSISTOR DEVICE", by Peyman Hadizad, assigned to the same assignee, Semiconductor Components Industries, LLC, filed concurrently herewith, and which is incorporated by reference for all purposes.

BACKGROUND OF THE INVENTION

This invention relates generally to high frequency power semiconductors, and more specifically to compound semiconductor field effect transistor (FET) structures and applications thereof.

In the area of computer and peripheral power supply applications, there are several factors driving future performance and demand. Such factors include an increase in output power requirements because of higher microprocessor speeds, smaller system size (i.e., reduced circuit board space), lower cost, improved transient response, and lower output voltage ripple (i.e., lower microprocessor operating voltages). Additionally; advancing microprocessor needs, which include decreasing operating voltage and increasing current requirements, will require power conversion devices and circuits that enable highly efficient and tightly regulated power. These devices and circuits must operate at higher frequencies and exhibit enhanced thermal characteristics.

Electronic systems such as computer and peripheral power supply applications often require that multiple dc voltage levels be produced from a single dc voltage source. This conversion is done with electronic circuits such as dc/dc converters. A basic converter circuit is a two-port network having a pair of input terminals and a pair of output terminals. A dc power source is coupled across the two input terminals, and a dc load is coupled across the two output terminals. Within the two-port network, the circuit typically comprises multiple switching devices, appropriate control circuitry, one or more capacitors, and one or more inductors. Typical dc/dc converters include the buck converter, the boost converter, and the buck-boost converter.

An ideal switching device has two states: on and off. In the on state, the ideal device conducts current between two terminals with zero voltage drop across the terminals. In the off state, the ideal device will support any voltage drop across the terminals while conducting zero current between them. A number of different semiconductor devices are used as switches in dc/dc converters, all of which depart from the ideal switching device in one or more ways. Examples of such devices include diodes, bipolar transistors, MOSFETs, silicon controlled rectifiers, and junction field effect transistors.

One problem with typical switching devices is a non-zero voltage between the terminals when in the on state. This results in power dissipation in the switching device, which generates heat and reduces overall circuit efficiency. A second problem involves the dynamic characteristics of the switching device when transitioning between the on state and the off state. Slow switching speeds place a limit on system operating frequency and duty cycle. Each time a device switches between states, a certain amount of energy is lost. The slower a device switches, the greater the energy lost in the circuit. This has significant impact on high frequency and/or high power applications, and contributes significantly to the reduction of overall efficiency of a dc/dc converter.

Most losses in switching power circuits are determined by the physical properties of semiconductor devices. Although silicon based MOSFET devices are a primary choice for many power conversion applications, they have inherent limitations for high frequency applications due to their physical structure. Such limitations include high reverse recovery charge, high gate charge, and high on resistance, which detrimentally impact power dissipation and thermal response characteristics.

Multi-phase dc/dc conversion is a preferred technique for addressing the high current/low operating voltage requirements of present and future microprocessors. In multiphase dc/dc converter architectures, a load is distributed evenly across phase-shifted pulse-width-modulation (PWM) channels and associated switching devices and inductors. This approach spreads power and current dissipation across several power handling devices thereby lowering stress on components. This approach also reduces output ripple on inductor current.

By way of example, a typical silicon-based multi-phase dc/dc converter for a 120 Amp, 500 kHz microprocessor system consists of four phases. A silicon-based multi-phase dc/dc converter for 1 MHz/120 Amp microprocessor system may consist of five phases, and a silicon-based multi-phase dc/dc converter for a 2 MHz/120 Amp system may consist of seven phases.

In multi-phase dc/dc converters, current levels are often sensed in each phase as a means of feedback control within a system. This is done typically using on-resistance of a silicon switching MOSFET device or series resistance of an output inductor. The on-resistance method current sensing is problematic due to variations in processing for silicon MOSFETs devices, which becomes even more of a problem at higher current levels. Additionally, with improvements in inductor designs and fabrication methods, the series resistance current sensing technique has become less reliable because the improvements make it difficult to distinguish the inductor resistance from system noise.

Accordingly, a need exists for switching devices suitable for the increasingly stringent demands of applications such as dc power conversion. Additionally, it would beneficial for such devices to make possible accurate phase current sensing.

DETAILED DESCRIPTION OF THE DRAWINGS

In general, the present invention pertains to a vertical compound semiconductor junction field effect transistor (JFET) structure. In a preferred embodiment, a first trench is formed in an upper surface of an n-type conductivity compound semiconductor layer, and a second trench is formed within the first trench to form a gate region. The gate region is then doped by ion implanting a p-type dopant species such as $Be^+$ into the lower sidewalls and bottom surface of the second trench. N-type source regions are formed on both sides of the double trench gate region. The opposite surface of the n-type conductivity compound semiconductor layer provides a drain region. The doped gate region extends along the channel region and is separated from the source regions to provide, among other things, an improved gate blocking characteristic. A gate-coupling region is used to connect a plurality of closely spaced doped gate regions. In a preferred embodiment, the structure comprises an n-channel depletion mode GaAs FET.

Unlike silicon, GaAs is a direct bandgap compound semiconductor material with an inherent property of high electron mobility (8500 $cm^2$/V-sec), which is greater than 4× that of silicon (1500 $cm^2$/V-sec). Also, GaAs has a larger bandgap of 1.42 eV compared to 1.1 eV for silicon, which provides, among other things, enhanced performance at elevated temperatures. Additionally, the reverse recovery charge of a GaAs FET device is approximately 100× lower than that of a silicon FET device. The double trench gate design according to the present invention together with a compound semiconductor material provides a vertical FET structure with improved switching and on resistance characteristics compared to silicon switching devices.

The present invention is better understood by referring to FIGS. 1–6 together with the following detailed description. For ease of understanding, like elements or regions are labeled the same throughout the detailed description and FIGURES where appropriate. Although the embodiment shown and described is a depletion mode n-channel FET device, the structure according to the present invention is suitable for p-channel and enhancement mode devices as well.

Figure 1:
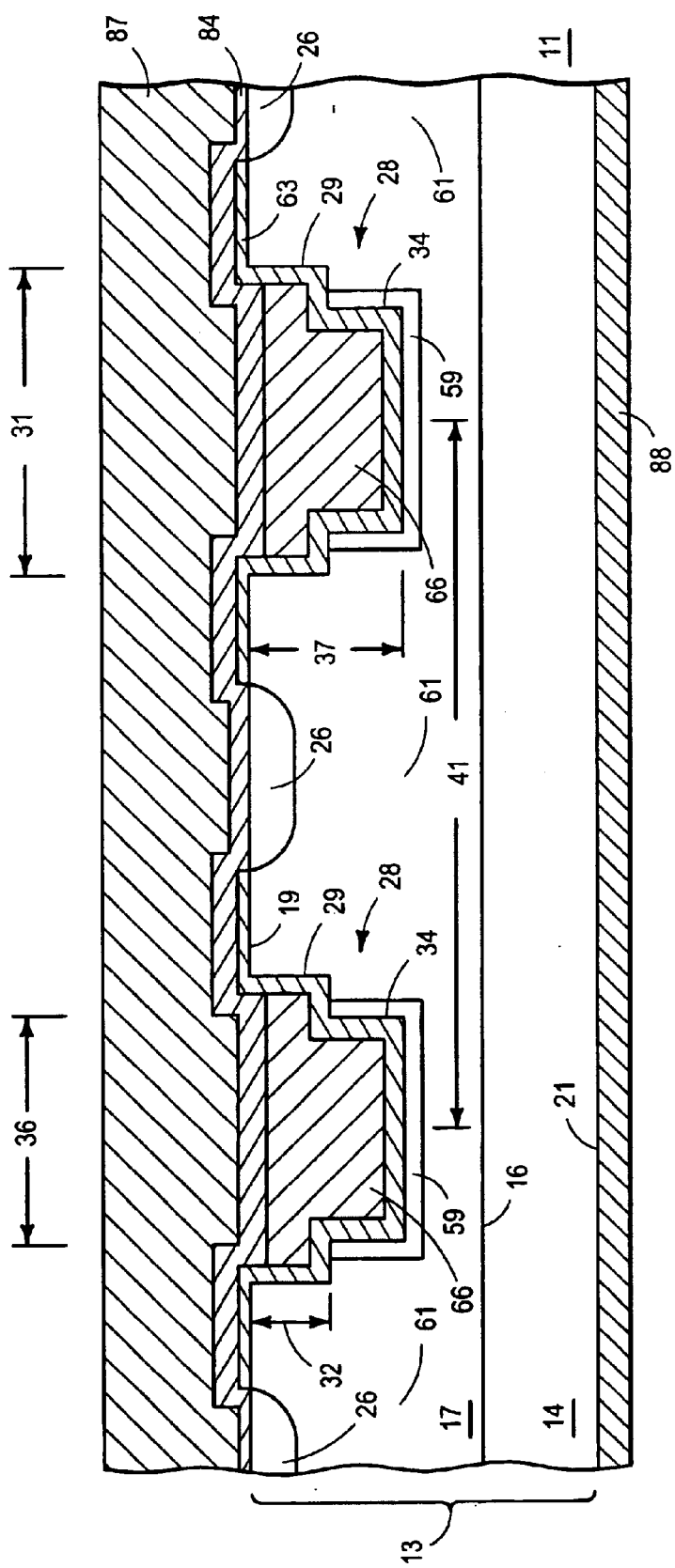
FIG. 1 illustrates, an enlarged cross-sectional view of a portion of a vertical FET device according to the present invention.

FIG. 1 shows an enlarged cross-sectional view of a vertical FET device or compound semiconductor vertical FET or JFET structure 11. Structure 11 comprises a body of semiconductor material 13, which preferably includes a starting or supporting substrate or wafer 14 having an upper surface 16. An epitaxial or drift layer or layers 17 is formed on upper surface 16. Body of semiconductor material 13 includes an upper or source surface 19 and a lower or opposing surface 21. Preferably, body of semiconductor material 13 comprises a compound semiconductor such as GaAs, InP or the like. Although only a portion of a FET device or cell is shown, structure 11 comprises a plurality of individual vertical FET devices or cells connected in parallel. Structure 11 forms, for example, a power switching FET or a sense FET.

In a preferred embodiment for an n-channel depletion mode (i.e., normally on) device, substrate 14 comprises n-type GaAs, and layer 17 comprises an n-type GaAs epitaxial layer, which preferably has a lower dopant concentration than substrate 14. The thickness and dopant concentration of layer 17 varies as a function of the desired device characteristics. Preferably, for a depletion mode FET device, layer 17 has a dopant concentration on the order of less than $5 \times 10^{17}$ atoms/$cm^3$ and a thickness greater than about 0.1 microns. Layer 17 is formed using conventional compound semiconductor epitaxial growth methods. The dopant profile of layer 17 is substantially constant, or the profile is graded depending on desired device characteristics. Alternatively, body of semiconductor material 13 comprises InP.

Source regions 26 are formed in and extend from upper surface 19. When layer 17 comprises an n type material, source regions 26 comprise n+ regions and preferably are formed using ion implantation techniques. For example, source regions 26 are formed using $Si^+$ implantation at a dose sufficient to lower contact resistance to subsequently formed contact layers. For example, a $Si^+$ dose of about $4.0 \times 10^{13}$ atoms/$cm^2$ with an implant energy on the order of 85 KeV being typical. Alternatively, selenium, tin, or tellurium is used to form source regions 26. In an alternative embodiment, multiple source implants at different implant doses and implant energies are used.

Structure 11 further includes a double trench gate, double groove gate, multiple trench gate, trench within a trench gate, or stepped trench gate structure 28 formed in and extending from upper surface 19 into layer 17. Preferably, trench structure 28 includes a first trench or groove portion 29 having a width 31 in a range from about 0.3 microns to about 1.5 microns, and a depth 32 in a range from about 0.5 microns to about 5 microns.

Trench structure 28 further includes a second trench or groove portion 34 having a width 36 in a range from about 0.25 microns to about 1.4 microns, and a depth 37 in a range from about 0.5 microns to about 5 microns. Preferably, the pitch or centerline-to-centerline distance 41 of adjacent trench gate structures 28 is in a range from about 1.3 to about 4.5 microns. These dimensions are variable according to specific device requirements. That portion of layer 17 between gate structures 28 forms channels or channel regions 61.

Structure 11 also includes doped gate regions 59, which preferably extend along sidewalls and lower surfaces of second trenches 34. For an n-channel device, doped gate regions 59 are p-type, and are formed preferably using angled ion implantation. Preferably, gate regions 59 and source regions 26 are activated using rapid thermal processing with a temperature up to about 900° C. for about 10 to 30 seconds being sufficient.

Trench structures 28 preferably are formed using reactive ion etching (RIE) or damage free electron cyclotron resonance (ECR) etching, which provides clean and straight sidewall features. A chlorine-based etch chemistry is preferred. In a preferred embodiment, second trench 34 is formed using spacers formed on the sidewalls of first trench 29, which are subsequently removed.

A dielectric or passivation layer 63 is formed over upper surface 19 including trench structures 28. Preferably, passivation layer 63 comprises a silicon nitride with a thickness in a range from about 0.05 microns to about 0.3 microns. Preferably, plasma enhanced chemical vapor deposition (PECVD) is used to form passivation layer 63. A dielectric layer is then formed over passivation layer 63, and planarized to form a trench-fill layer 66. Trench-fill layer 66 provides for, among other things, better step coverage for subsequently formed conductive layers, and preferably comprises a low temperature oxide, silicon nitride, or a spin on dielectric. Trench-fill layer 66 is formed using etch-back or chemical mechanical planarization (CMP) techniques.

Openings are then formed in dielectric layer 63 to provide contacts to source regions 26. Additionally, portions of trench-fill layer 66 and passivation layer 63 are removed to expose portions of a gate connecting region 79 (shown in FIG. 2). A first metal or contact layer is formed over upper surface 19, and patterned to provide a source contact 84 and a gate contact 86 (shown in FIG. 2). Source contact layer 84 and gate contact layer 86 preferably comprise NiGeAu, NiGeW, or another suitable metal. A second contact layer or metal layer 87 is formed over source contact 84 and gate contact 86. Second metal layer 87 preferably comprises nickel or gold, and is formed using electroplating or electroless plating techniques. Body of semiconductor material 13 is thinned using a backgrind step, and a back metal or drain contact layer 88 is deposited on lower surface 21. Drain contact layer 88 comprises NiGeAu, or another suitable metal.

Figure 2:
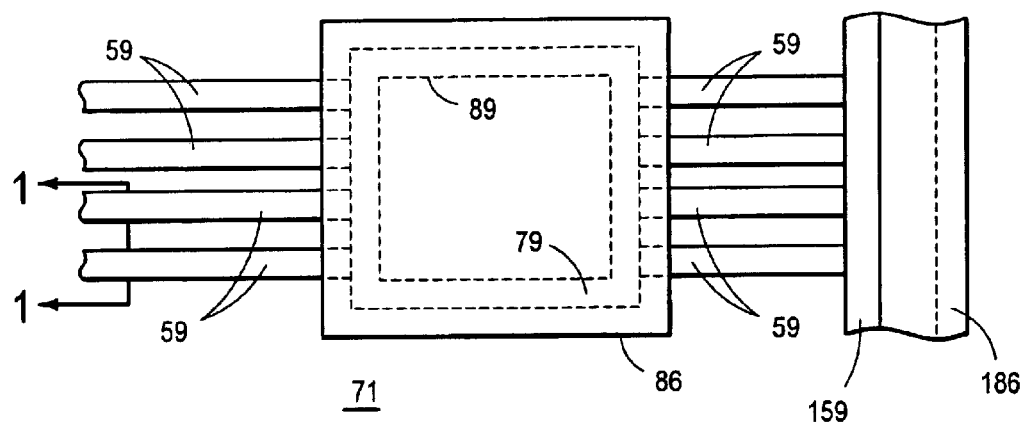
FIG. 2 illustrates a partial top plan view of a gate control structure for device of FIG. 1.
Figure 3:
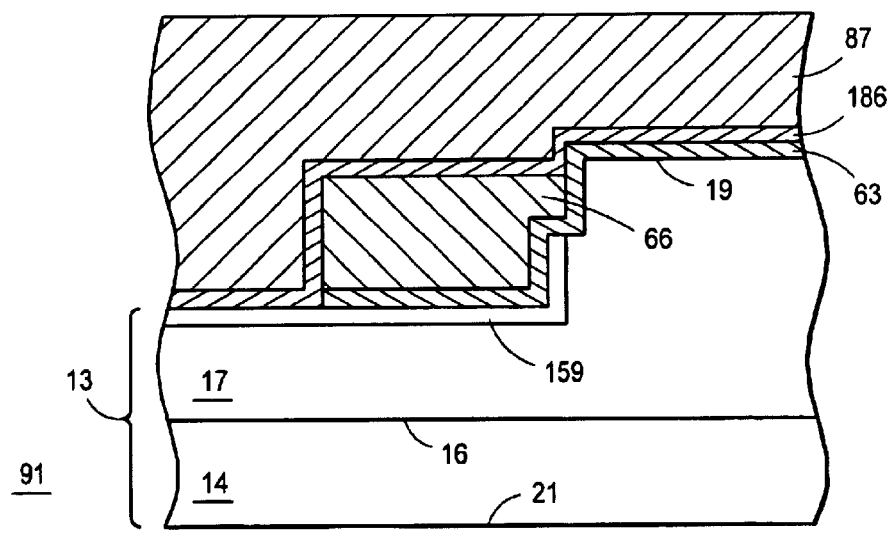
FIG. 3 illustrates an enlarged cross-sectional view of a portion of an edge termination structure for the device of FIG. 1.

FIG. 2 shows an enlarged partial top plan view of a preferred gate contact structure 71, which includes doped connecting region 79. Doped gate connecting region 79 ties or couples together a plurality of doped gate regions 59 in a single contact region. For ease of understanding, structure 11 shown in FIG. 1 is taken along reference line 1—1 of FIG. 2. Phantom line 89 represents an alternative placement for gate contact layer 86. Doped termination region 159 and termination contact layer 186 are part of a preferred termination structure 91, which is described next in FIG. 3.

Termination structure 91 is formed on a periphery or perimeter of vertical FET structure 11. Structure 91 includes a termination region 159 that is formed at the same time as doped gate regions 59, and comprises the same conductivity type (e.g., p-type when structure 11 comprises an n-channel device). Termination structure 91 provides a means for controlling electric field spread and electric field shape during device operation, and preferably is coupled to gate connecting region 79 as shown in FIG. 2.

By using multiple trench structure 28 according to the present invention, gate region 59 is placed deeper into channel regions 61 and is more separated from source regions 26 thereby improving gate blocking characteristics. Also, by using a doped gate region, the blocking characteristics are further improved compared to conventional Schottky gate designs. Also, because structure 11 comprises a compound semiconductor material, structure 11 has a reduced gate charge, reduced gate resistance, and enhanced switching speeds compared to silicon based devices.

In addition, for a given output current and switching frequency, structure 11 dissipates less power thereby allowing one to use a smaller chip size and a reduced number of phases. Additionally, by using a reduced width second trench 34 and gate connecting regions 79 to couple a plurality of gate regions together, the plurality of doped gate regions 59 are placed close together thereby improving device performance. Moreover, compound semiconductor structure 11 provides a preferred depletion mode or normally on FET device that has advantages for advanced multi-phase power conversion applications because, among other things, a depletion mode device has a lower series resistance compared to an enhancement mode device.

Furthermore, structure 11 can handle more current per phase in a multiphase power conversion application compared to silicon-based or enhancement mode devices. For example, for a 120A/500 kHz application, three phases are required with structure 11 compared to four for a silicon-based device. For a 120A/1 MHz application, four phases are required with structure 11 compared to 5 for a silicon-based device. For a 120A/2 MHz application, four phases are sufficient using structure 11 compared to seven for a silicon-based device. This also enables a smaller system size thereby saving on pc board space, which makes the structure according to the present invention a cost effective alternative for high power/high frequency applications.

Figure 4:
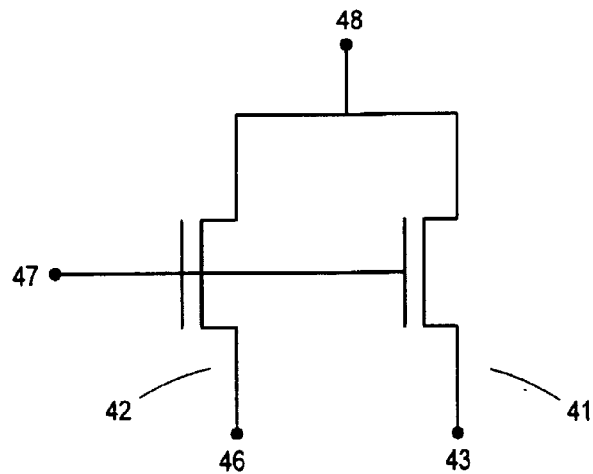
FIG. 4 illustrates a circuit diagram including the device of FIG. 1 together with a sense FET device according to the present invention.

Vertical FET device 11 further provides a structure that enables an integration of an improved sense FET in a multi-chip configuration or a single chip configuration. FIG. 4 shows a circuit diagram of a main vertical FET device or cells 41 and a vertical sense FET device or cells 42 according to the present invention. Main FET 41 and sense FET 42 includes source nodes 43 and 46 respectively. The FET devices share a common gate node 47 and a common drain node 48.

Figure 5:
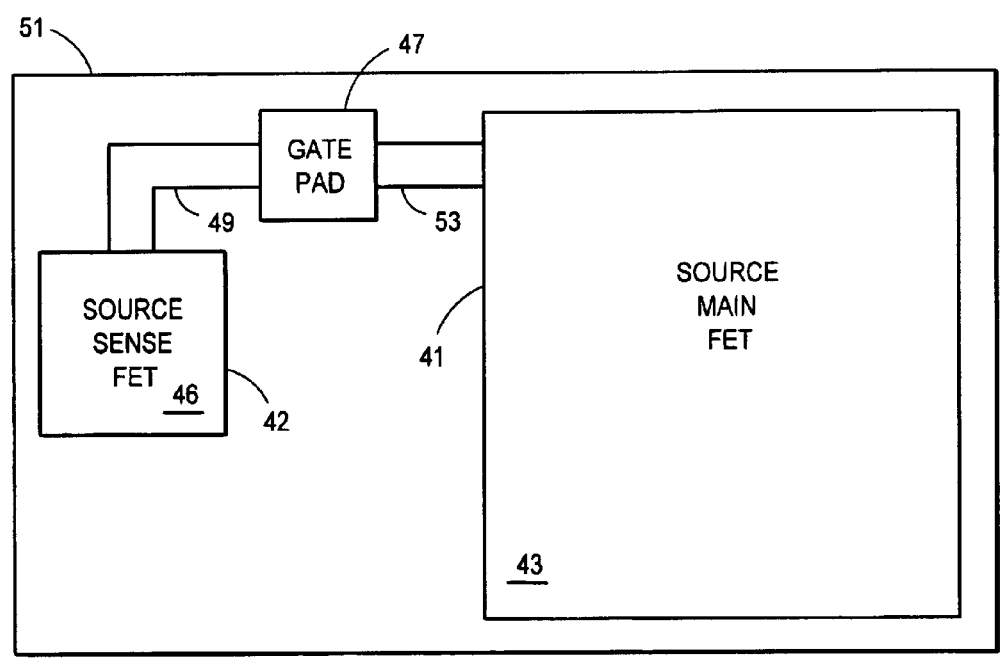
FIG. 5 illustrates a simplified top plan view of embodiment of FIG. 4.

FIG. 5 is a top plan view of one embodiment of FIG. 4 showing a simplified chip layout 51. Gate pad 47 is coupled to main FET cells 41 through connecting region 53, and is coupled to sense FET cells 42 through connecting region 49. Common drain 48 (not shown) is a backside contact in this embodiment. The desired current sensing ratio and accuracy is what determines the total area of sense FET cells 42 compared to the total area of main FET cells 41. The physical location of sense FET device 42 on chip 51 is determined by electrical, thermal and package/board layout requirements. As shown, the source regions of sense FET 42 are electrically isolated from the source regions of main FET 41. Typically, the space requirements for sense FET 42 are less than main FET 43, which provides a cost effective integration. Additionally, sense FET 42 preferably comprises a depletion mode double trench compound semiconductor design.

Figure 6:
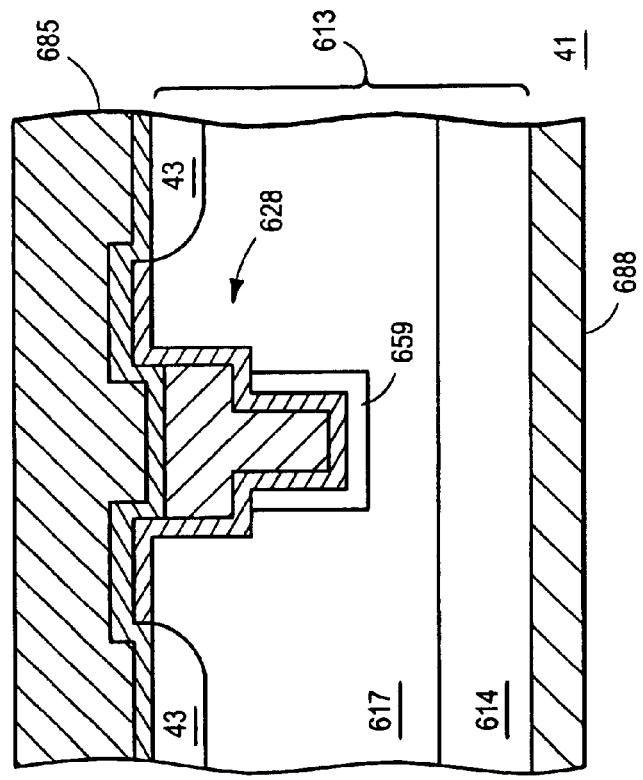
FIG. 6 illustrates an enlarged cross-sectional view of a portion of the embodiment of FIG. 4.
Figure 6:
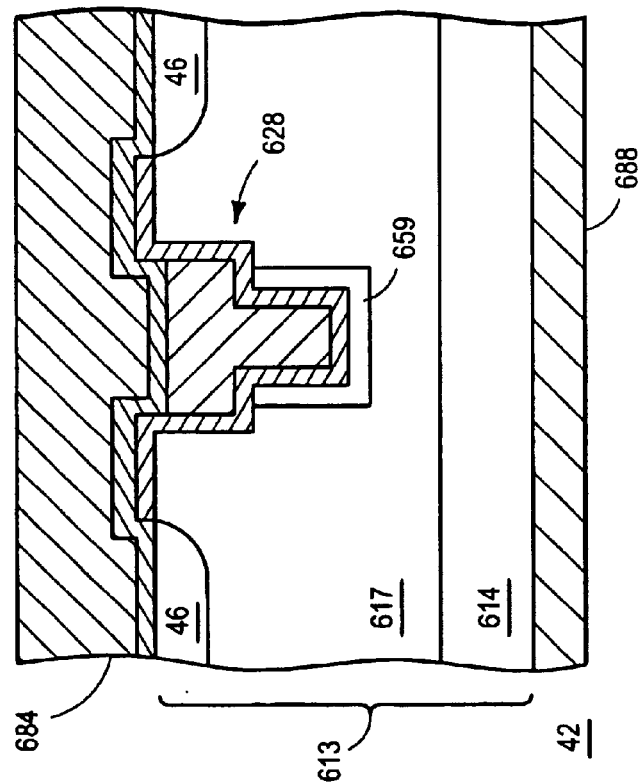

FIG. 6 shows enlarged cross-sectional views of main FET 41 and sense FET 43 according to the present invention. Main FET 41 and sense FET 42 can be separate devices or integrated as shown in FIG. 6. In this embodiment, main FET 41 and sense FET 42 comprise a body of semiconductor material 613. Body of semiconductor material 613 preferably includes a starting substrate or wafer 614 and an epitaxial or drift layer 617 formed on wafer 614. Preferably, epitaxial layer 617 has a dopant concentration on the order of less than $5.0 \times 10^{17}$ atoms/cm3, and a thickness greater than about 0.1 micron.

Main FET 41 further includes source regions 43, and sense FET 42 further includes source regions 46, which are formed, for example, in the same as source regions 26 in structure 11. Both FET devices include double gate structures 628, which are formed in the same way as gate structures 28. Both FET devices include doped gate regions 659, which are formed, for example, in the same way as doped regions 59. Sense FET source contact layer or layers 684 provide contact to sense FET source regions 46, and main FET source contact layer or layers 685 provide separate and electrically isolated contact to main FET source regions 43. Contact layer 688 provides a common drain contact for both main FET 41 and sense FET 42.

Thus it is apparent that there has been provided, in accordance with the present invention, a vertical compound semiconductor FET device. A trench within a trench gate structure provides a FET device with improved gate blocking characteristics. Additionally, the FET device has improved high frequency performance characteristics compared to conventional silicon FET devices including enhanced mobility, improved reverse recovery, lower on resistance, and reduced gate charging effects. In addition, the structure according to the present invention provides a sense FET structure that is integrated with a main vertical FET to provide current sensing for applications such as multi-phase power conversion. Furthermore, the structure according to the present invention provides an improved switching device for high power/high frequency dc/dc power conversion applications compared to silicon-based switching devices and other enhancement mode switching mode devices.

Although the invention has been described and illustrated with reference to specific embodiments thereof, it is not intended that the invention be limited to these illustrative embodiments For example, the structure according to the present invention is suitable for p-channel structures. Those skilled in the art will recognize that modifications and variations can be made without departing from the spirit of the invention. Therefore, it is intended that this invention encompass all such variations and modifications as fall within the scope of the appended claims.

I claim:

1. A vertical FET device comprising:
   a body of semiconductor material comprising a first conductivity type, wherein the body of semiconductor material has an upper surface and a lower surface opposing the upper surface, wherein the lower surface provides a drain contact;
   a first trench formed in the body of semiconductor material and extending from the upper surface, wherein the first trench has a first width, a first depth from the upper surface, first sidewalls, and a first bottom surface;
   a second trench formed within the first trench, wherein the second trench has a second width, a second depth from the first surface, second sidewalls and a second bottom surface, wherein the first and second trenches form a first trench structure;
   a first source region formed in the body of semiconductor material extending from the upper surface and spaced apart from the first trench; and
   a first doped gate region formed in at least a portion of the second sidewalls and the second bottom surface, wherein the doped gate region comprises a second conductivity type, and wherein the first doped gate region extends into the body of semiconductor material.

2. The device of claim 1 wherein the body of semiconductor material comprises a III-V semiconductor substrate having a first dopant concentration and a first epitaxial layer formed on a surface of the semiconductor substrate, wherein the first epitaxial layer has a second dopant concentration less than the first dopant concentration.

3. The device of claim 1 wherein the body of semiconductor material comprises one of GaAs and InP.

4. The device of claim 1 further comprising;
   a first passivation layer formed over the doped gate region; and
   a planarized passivation layer formed over the first passivation layer.

5. The device of claim 1 further comprising a second source region in the body of semiconductor material spaced apart from the first trench, wherein the first trench is between the first and second sources.

6. The device of claim 1 further comprising a gate coupling region formed in the body of semiconductor material, wherein the gate coupling region is connected to the first doped gate region.

7. The device of claim 1, wherein the vertical FET device comprises a depletion mode FET device.

8. The device of claim 7, wherein the depletion mode FET comprises an n-channel depletion mode FET device.

9. The device of claim 1 further comprising:
   a second trench structure formed in the body of semiconductor material;
   a second source region formed in the body of semiconductor material extending from the upper surface and spaced apart from the second trench structure;
   a second doped gate region formed in the second trench structure;
   a first source contact region coupled to the first source region;
   a second source contact region electrically isolated from the first source contact region and coupled to the second source region;
   a common drain region formed in the body of semiconductor material; and
   a gate contact region coupled to the first and second doped gate regions.

10. A compound semiconductor vertical FET device comprising:
    a first groove formed in a compound semiconductor layer of a first conductivity type, wherein the first groove has first sidewalls and a first lower surface, and wherein the first groove extends from a first surface of the compound semiconductor layer;
    a second groove formed within the first groove, wherein the second groove has second sidewalls and a second lower surface;
    a doped gate region formed in the second lower surface and at least a portion of the second sidewalls and extending into the compound semiconductor layer, wherein the doped gate region comprises a second conductivity type;
    a first source region of the first conductivity type formed in the compound semiconductor layer adjacent to the first groove;
    a source contact coupled to the first source region;
    a gate contact coupled to the doped gate region; and
    a drain contact formed on a second surface of the compound semiconductor layer.

11. The device of claim 10 wherein the body of compound semiconductor material comprises one of GaAs and InP.

12. The device of claim 10 wherein the vertical FET device forms an n-channel depletion mode sense FET.

13. The device of claim 10 wherein the vertical FET device forms an n-channel depletion mode power switching FET.

* * * * *